(12) United States Patent
Kim et al.

(10) Patent No.: US 6,192,063 B1
(45) Date of Patent: Feb. 20, 2001

(54) POLARIZATION-DEPENDENT TYPE DIRECTIONAL ISOLATOR AND RING-TYPE RESONATOR LASER

(75) Inventors: Myong Wook Kim; Bong Kyu Kim; Young Min Jhon; Sang Kuk Kim, all of Seoul (KR)

(73) Assignee: Korea Institute of Science and Technology, Seoul (KR)

( * ) Notice: Under 35 U.S.C. 154(b), the term of this patent shall be extended for 0 days.

(21) Appl. No.: 09/098,625

(22) Filed: Jun. 17, 1998

(30) Foreign Application Priority Data

Mar. 4, 1998 (KR) .................................................. 98-7065

(51) Int. Cl.[7] .............................. H01S 3/083; G02B 5/30
(52) U.S. Cl. ............................ 372/94; 359/497; 359/501; 372/106
(58) Field of Search ...................................... 359/494–501; 372/27, 94, 105, 106; 385/11

(56) References Cited

U.S. PATENT DOCUMENTS

| | | | |
|---|---|---|---|
| 5,278,853 | * | 1/1994 | Shirai et al. .............................. 372/37 |
| 5,345,329 | * | 9/1994 | Shirai et al. ....................... 359/494 X |
| 5,452,122 | * | 9/1995 | Tsuneda et al. ................... 359/501 X |
| 5,499,307 | * | 3/1996 | Iwatsuka ................................. 385/11 |
| 5,504,771 | * | 4/1996 | Vahala et al. ........................... 372/94 |
| 5,557,692 | * | 9/1996 | Pan et al. ................................ 385/11 |
| 5,905,823 | * | 5/1999 | Shintaku et al. ........................ 385/11 |
| 5,912,766 | * | 6/1999 | Pattie ............................... 359/497 X |
| 5,936,768 | * | 8/1999 | Oguma .............................. 359/495 X |

* cited by examiner

Primary Examiner—John D. Lee
(74) Attorney, Agent, or Firm—Oblon, Spivak, McClelland, Maier & Neustadt, P.C.

(57) ABSTRACT

A polarization-dependent type directional isolator. The polarization-dependent type directional isolator comprises a pair of first optical means positioned at a path along which light travels for changing the rotation direction of an incident light depending on the traveling direction of the incident light; a pair of second optical means for rotating the incident light by a given angle; and a third optical means positioned between the pair of second optical means for passing through only specific components of the components of the incident light, thereby making it possible to obtain laser outputs oscillating in both directions independently.

10 Claims, 2 Drawing Sheets

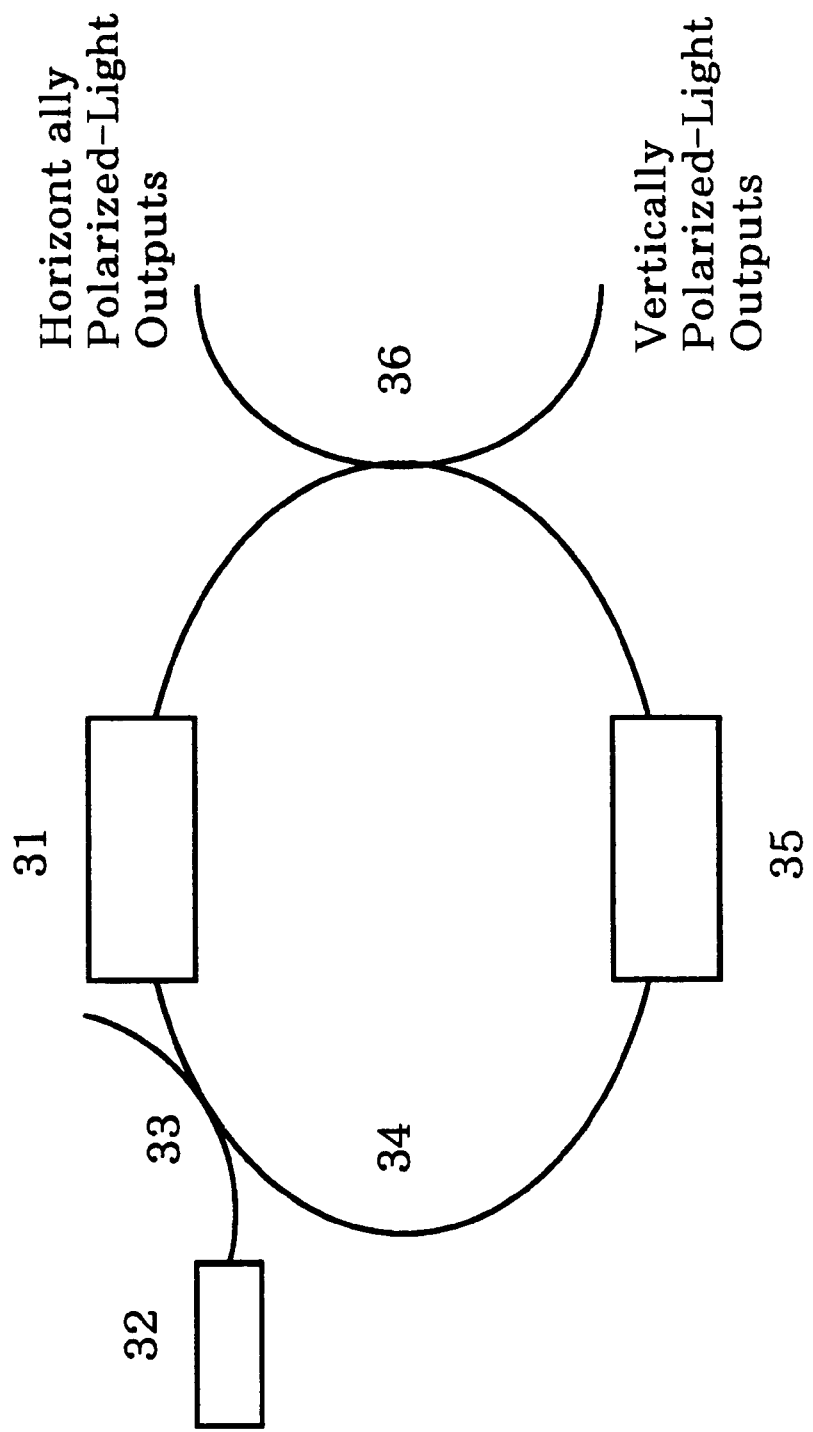

POLARIZATION-DEPENDENT TYPE DIRECTIONAL ISOLATOR AND RING-TYPE RESONATOR LASER

BACKGROUND OF THE INVENTION

1. Field of the Invention

The present invention relates generally to laser optics and technology making use of the isolator, and more particularly to, a polarization-dependent type directional isolator and a ring-type resonator laser making use of it.

2. Description of the Prior Art

Currently, in order to select the travelling direction of polarized light, a method for forcing only a specific polarized light to travel along one direction by use of an optical isolator has been widely used. This method has an advantage that it can prevent influence due to interference caused by a backwardly travelling light because it allows only a straight polarized light to travel along a single direction in a ring-type resonator laser. However, the conventional method has a disadvantage that it cannot obtain light travelling in the opposite direction, since it only allows the light to travel along a single direction.

SUMMARY OF THE INVENTION

It is therefore an object of the present invention to provide a polarization-dependent type directional isolator and a ring-type resonator laser making use of it, which allow laser light to oscillate in both directions independently without interfering with each other within a gain medium, by maintaining the lights, whose polarized states are orthogonal to each other, to travel in directions opposite to each other.

In order to accomplish the above object, according to one aspect of the present invention, there is provided a polarization-dependent type directional isolator of a novel structure, which comprises a pair of first optical means positioned at a path along which light travels, for changing the rotating direction of an incident light according to the travelling direction of the incident light; a pair of second optical means for rotating the incident light by a given angle; and a third optical means positioned between the pair of second optical means, for passing through a specific component of the components of the incident light.

According to another aspect of the present invention, there is provided a ring-type resonator laser of a novel structure, which comprises exciting optical source; wavelength split-combining means for splitting or combining wavelengths of light from the exciting optical source; amplifying medium for amplifying light from the wavelength split-combining means; polarization-dependent type directional isolator for forcing the light from the wavelength split-combining means to travel along specific directions, the amplifying medium and the polarization-dependent type directional isolator being connected by an optical fiber so that a loop can be formed; and mixer for outputting only vertically or horizontally polarized light of the lights passing through the amplifying medium and the polarization-dependent type directional isolator, the polarization-dependent type directional isolator comprising a pair of first optical means positioned at a path along which light travels, for changing the rotating direction of an incident light according to the travelling direction of the incident light; a pair of second optical means for rotating the incident light by a given angle; and a third optical means positioned between the pair of second optical means, for passing through only specific components of the components of the incident light.

BRIEF DESCRIPTION OF THE DRAWINGS

The aforementioned aspects and other features of the present invention will be explained in the following description, taken in conjunction with the accompanying drawings, wherein:

FIG. 3 shows a construction of a ring-type resonator laser utilizing the polarization-dependent type directional isolator according to the present invention.

DETAILED DESCRIPTION OF PREFERRED EMBODIMENTS

Figure 1:
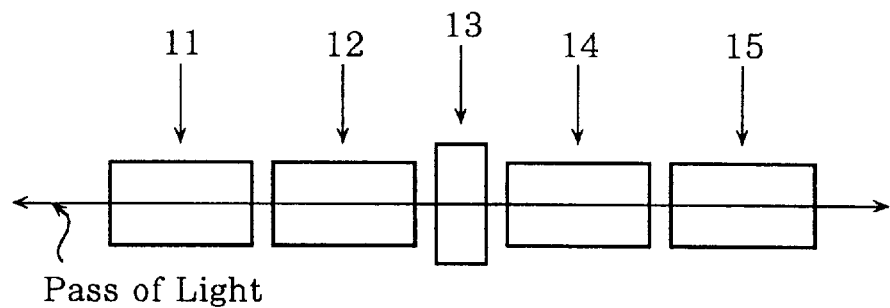
FIG. 1 shows a construction of a polarization-dependent type directional isolator according to one embodiment of the present invention.

The present invention will be described in detail by way of the embodiments with reference to accompanying drawings, in which like reference numerals are used to identify the same or similar parts.

FIG. 1 shows a construction of a polarization-dependent type directional isolator according to one embodiment of the present invention, wherein a pair of Faraday polarization rotation plates 11, 14 and a pair of ½ wavelength plates 12, 15 are positioned along a path on which light travels. The pair of Faraday polarization rotation plates 11, 14 utilizes the optical phenomenon called Faraday effect, and functions to determine the rotating direction of a polarized light depending on the nonreversible characteristic by which the rotating direction of the polarized light is changed when the travelling direction of light changes. The pair of ½ wavelength plates 12, 15 function to differentiate the components of an output light depending on the components of an incident polarized light, that is, to rotate the incident light by 45° in the present invention. In the embodiment of the present invention, one plate 12 of the pair of the ½ wavelength plates 12, 15 is positioned between the pair of Faraday rotating plates 11, 14. Finally, there is provided a polarized plate 13 which functions to pass through only a specific component of the components of the light. For example, it may function to pass through the vertical components of the incident light but not the horizontal components of the incident light.

There are shown variations in polarization depending on the travelling directions of light in FIG. 1, which will be explained below in detail by reference to FIGS. 2(a) to 2(d).

First, referring to FIG. 2(a), the polarized state for a vertically polarized light traveling from left to right will be explained.

Figure 2:
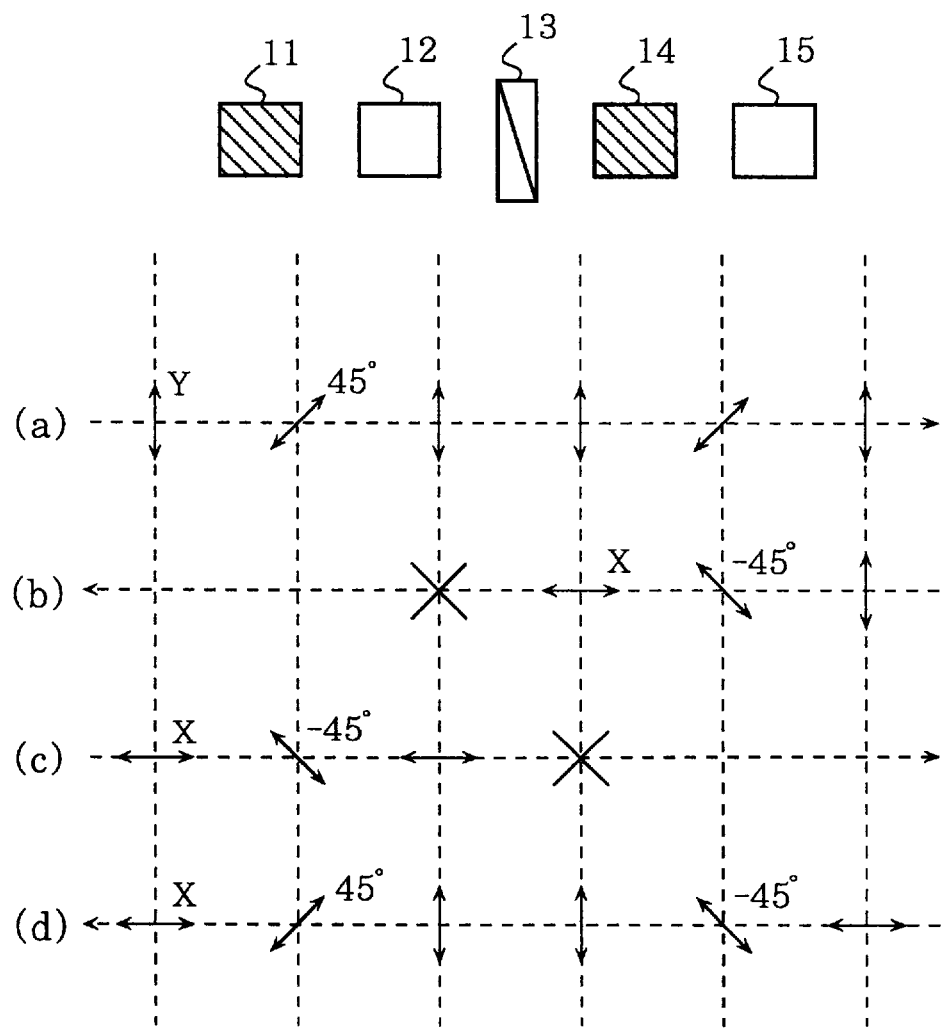
FIGS. 2(a) to 2(d) show variations in polarization according to the travelling direction of light in FIG. 1.

The polarization direction of the vertically (Y direction in FIG. 2(a)) incident light is rotated by 45° in the clockwise direction through the Faraday polarization rotation plate 11. Then, the 45-direction rotated light is rotated again by 45° in the counter-clockwise direction through the ½ wavelength plate 12 to thereby maintain its original vertically polarized-light state. Next, the vertically polarized-light state passes through the polarization plate 13, the Faraday polarization rotation plate 14 and the ½ wavelength plate 15 sequentially, to maintains its original vertically polarized-light state.

Thereafter, referring to FIG. 2(b), the polarization state for a vertically polarized light traveling from right to left will be explained.

The polarization direction of the vertically incident light is rotated by 45° in the counter-clockwise direction through the ½ wavelength plate 15. Then, the (−45°)-direction rotated light is rotated again by 45° in the counter-clockwise direction through the Faraday polarization rotation plate 14 which has directivity, to thereby maintain a horizontally polarized-light state. Therefore, the horizontally polarized-light state cannot pass through the polarization plate 13.

As a result, by the above construction of the present invention, vertically incident light can travel only from left to right.

Then, referring to FIG. 2(c), the polarization state for a horizontally polarized light traveling from left to right will be explained.

The polarization direction of the horizontally incident light (X direction in FIG. 2(c)) is rotated by 45° in the clockwise direction through the Faraday polarization rotation plate 11. Then, the (45°)-direction rotated light is rotated again by 45° in the counter-clockwise direction through the ½ wavelength plate 12, to thereby maintain its original horizontally polarized-light state. Therefore, the horizontally polarized-light state cannot pass through the polarization plate 13.

Finally, referring to FIG. 2(d), the polarization state for a horizontally polarized light traveling from right to left will be explained.

The polarization direction of the horizontally incident light is rotated by 45° in the counter-clockwise direction through the ½ wavelength plate 15. Then, the (−45°)-direction rotated light is again rotated by 45° in the clockwise direction through the Faraday polarization rotation plate 14, thereby it maintains a vertically polarized-light state. Next, the vertically polarized-light state passes through the polarization plate 13, the ½ wavelength plate 12 and the Faraday polarization rotation plate 11, to thereby maintain its original horizontally polarized-light state.

With this construction, horizontally incident light may travel only from right to left.

According to the directional isolator of the present invention, since the traveling direction of light is determined depending upon the polarization state of light, it can be seen that vertically incident light can travel only from left to right and horizontally incident light can travel only from right to left.

In FIG. 1, the Faraday polarization rotation plate 14 and the ½ wavelength plate 15, and the Faraday polarization rotation plate 11 and the ½ wavelength plate 12 may be positioned interchangeably. In this case, it should be noted that the same effect as mentioned above may be obtained.

Next, FIG. 3 shows a construction of a ring-type resonator laser utilizing the polarization-dependent type directional isolator according to the present invention.

In FIG. 3, reference numeral 31 indicates an amplifying medium for amplifying light; 32 an exciting optical source for applying a light energy; 33 a wavelength split combiner for splitting or combining different wavelengths of light; 34 an optical path or an optical fiber; 35 the polarization-dependent type directional isolator according to the present invention; and 36 a mixer for combining or splitting light, respectively. The amplifying medium 31 and the polarization-dependent type directional isolator 35 are connected by means of the optical fiber 34 so that a loop can be formed.

The operation of the ring-type resonator laser will now be explained below.

The light applied by the exciting source 32 are combined or split to same wavelengths by means of the wavelength split combiner 33. Then, the combined or split light is circulated in both directions to pass through the amplifying medium 31 and the polarization-dependent type directional isolator 35. During this circulation, the energy of the light may be amplified to a given level by the amplifying medium 31. The amplified light can produce laser outputs, i.e., horizontally polarized-light outputs and vertically polarized-light outputs, which are oscillated in both directions independently by means of the polarization-dependent type directional isolator 35. Next, the produced light is extracted by the mixer 36. With this construction, horizontally and vertically polarized-light outputs, i.e., laser outputs oscillating in both directions independently can be obtained.

Although the present invention has been described with reference to a particular embodiment in connection with a particular application, those having ordinary skill in the art and access to the teachings of the present invention will recognize additional modifications and applications within the scope thereof.

It is therefore intended by the appended claims to cover any and all such applications, modifications, and embodiments within the scope of the present invention.

From the foregoing, the polarization-dependent type directional isolator according to one embodiment of the present invention can provide an advantage that laser outputs oscillating in both directions independently and polarized orthogonally can be obtained without interfering with each other within a gain medium, since the travelling direction of light is determined depending on the polarized state of light.

What is claimed is:

1. A polarization-dependent type directional isolator for allowing incident polarized lights to travel in directions opposite to each other, comprising:

a pair of first optical means positioned at a path along which the incident polarized light travel, each of the pair of first optical means non-reciprocally rotating each of the incident polarized lights;

a pair of second optical means connected to each of the pair of first optical means for reciprocally rotating the incident polarized lights by a given angle based on the traveling direction thereof; and a third optical means positioned between one of the pair of first optical means and one of the pair of second optical means for passing specific components of the incident polarized light, wherein one of said pair of second optical means is disposed between said pair of first optical means, whereby the isolator passes only a vertical component of an incident polarized light traveling in a first direction and only a horizontal component of another incident polarized light traveling in an second direction opposite the first direction.

2. The polarization-dependent type directional isolator according to claim 1, wherein said pair of first optical means include a pair of Faraday polarization rotation plates, said pair of second optical means includes a pair of ½ wavelength plates and said third optical means includes a polarization plate, respectively.

3. The polarization-dependent type directional isolator according to claim 1, wherein said third optical means passes vertical components of incident polarized lights but not horizontal components of incident polarized lights.

4. The polarization-dependent type directional isolator according to claim 1, wherein said given angle is 45°.

5. A ring-type resonator laser comprising:

an exciting optical source;

a wavelength split-combining means for splitting or combining wavelengths of incident polarized lights from the exciting optical source;

an amplifying medium for amplifying each of the incident polarized lights from the wavelength split-combining means;

a polarization-dependent type directional isolator connected to the amplifying means by an optical fiber to form a loop for forcing each of the incident polarized lights from the wavelength split-combining means to travel along specific directions; and a mixer for outputting only vertical or horizontal components of the incident polarized lights passing said amplifying medium, wherein said polarization-dependent type directional isolator includes:

a pair of first optical means positioned at a path along which the incident polarized lights travel, each of the pair of first optical means non-reciprocally rotating each of the incident polarized lights;

a pair of second optical means connected to each of the pair of first optical means for reciprocally rotating the incident polarized lights by a given angle based on the traveling direction thereof; and a third optical means positioned between one of the pair of first optical means and one of the pair of second optical means for passing specific components of the incident polarized lights, wherein one of said pair of second optical means is disposed between said pair of first optical means, whereby the isolator passes only the vertical component of an incident polarized light traveling in a first direction and only the horizontal component of another incident polarized light traveling in a second direction opposite the first direction.

6. The ring-type resonator laser according to claim 5, wherein said pair of first optical means includes a pair of Faraday polarization rotation plates, said pair of second optical means includes a pair of ½ wavelength plates, and said third optical means includes a polarized-light plate, respectively.

7. The ring-type resonator laser according to claim 5, wherein said third optical means passes vertical components of incident polarized lights but not horizontal components of incident polarized light.

8. The ring-type resonator laser according to claim 5, wherein said given angle is 45°.

9. An optical isolator for selectively passing an incident light depending on the polarization direction of the incident light, comprising:

a pair of Faraday rotators;

a pair of optical reciprocal rotators; and a polarizer, wherein one of said pair of optical reciprocal rotators is disposed between said pair of Faraday rotators while said polarizer is disposed between one of said pair of Faraday rotators and one of said pair of optical reciprocal rotators, whereby said optical isolator allows an incident light, polarized in a first direction, to pass only in a forward direction and another incident light, polarized in a second direction opposite to the first direction, to pass only in a reverse direction.

10. The optical isolator according to claim 9, wherein said incident light polarized in the first direction is orthogonal to said another incident light polarized in the second direction.

\* \* \* \* \*